(12) United States Patent
Gagnon et al.

(10) Patent No.: US 10,225,115 B1
(45) Date of Patent: Mar. 5, 2019

(54) LOW-FREQUENCY PERIODIC SIGNAL DETECTOR

(71) Applicant: Cadence Design Systems, Inc., San Jose, CA (US)

(72) Inventors: Mathieu Gagnon, Verdun (CA); Santiago Luis Bortman, Chevy Chase, MD (US); Eric Harris Naviasky, Ellicott City, MD (US); Guillaume Fortin, Montreal (CA); Julien Faucher, Montreal (CA)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 64 days.

(21) Appl. No.: 15/286,432

(22) Filed: Oct. 5, 2016

(51) Int. Cl.
*G06F 1/12* (2006.01)
*H03K 5/24* (2006.01)
*G11C 27/02* (2006.01)
*H04L 25/06* (2006.01)

(52) U.S. Cl.
CPC .............. *H04L 25/062* (2013.01); *G06F 1/12* (2013.01); *G11C 27/02* (2013.01); *H03K 5/24* (2013.01)

(58) Field of Classification Search
CPC ..... H04L 25/06; H04L 25/061; H04L 25/062; G06F 1/12; G11C 27/02; G11C 27/022; G11C 27/024; G11C 27/026; G11C 27/028; H03K 5/24
USPC ..................................... 327/1, 18–21, 39–49
See application file for complete search history.

(56) References Cited

U.S. PATENT DOCUMENTS 7,285,994 B2 * 10/2007 Dalton ................. H03D 13/004
  327/12
7,639,086 B2 * 12/2009 Lee ....................... H03L 7/0891
  327/157

* cited by examiner

*Primary Examiner* — Lincoln D Donovan
*Assistant Examiner* — Diana J. Cheng
(74) *Attorney, Agent, or Firm* — Hunton Andrews Kurth LLP

(57) ABSTRACT

A system and a method for detecting a low-frequency periodic signal (LFPS) include at least one comparator performing a threshold comparison on an analog input signal over a period of time. A sampling circuit generates digital signals by sampling an output of the at least one comparator. A digital detection circuit applies a set of detection rules to the digital signals. The detection rules are configured to detect a presence or an absence of an LFPS based on predefined criteria concerning characteristics of the digital signals.

20 Claims, 18 Drawing Sheets

LOW-FREQUENCY PERIODIC SIGNAL DETECTOR

FIELD OF THE INVENTION

This description relates to the field of signal transmission, specifically the detection of a low-frequency periodic signal (LFPS) by a receiver device.

BACKGROUND

In electronic communications between a transmitter and a receiver, LFPSs are sometimes used to initiate transactions. For example, in a Universal Serial Bus (USB) link, an LFPS may be a handshake signal between the two ends of the link before initiating high-frequency data transmission. An LFPS can be used to bring back a far-end device from a power-down state. LFPSs may be sent by a high-speed transmitter, e.g., by sending many identical digital bits, although other methods can be used.

Although most of the time the LFPS is sent continuously until detection is achieved, some information may also be exchanged using intermittent LFPSs. For example, LFPS "ping" signals are short LFPS sequences that are used to change test patterns sent by the far-end device in certain testing modes. The low-frequency nature of the LFPS is meant to make it easy to detect, without requiring sophisticated bit recovery. Intersymbol interference (ISI) is minimized by the low frequency of the LFPS.

Conventional LFPS detection circuits, which employ an analog filter, are highly susceptible to detection errors. For example, an analog low-pass filter may include a resistor (R) and a capacitor (C), both of which are subject to manufacturing or temperature induced variations that change the corner frequency (commonly defined as the frequency where the received signal is attenuated by 3 decibels or dB). Increasing the corner frequency leads to an amplitude drop at the filter output, while decreasing the corner frequency increases the amplitude. Thus, the filter may erroneously block LFPSs or erroneously pass high-frequency signals.

Another limitation of analog filters is that they may contribute to false detection of LFPSs by passing intermediate and low-frequency components of a high-frequency signal that varies in instantaneous frequency. Thus, a detector circuit operating on the output of an analog filter might register the envelope of a high-frequency signal as being an LFPS. To prevent such false detection, the R or C components may have to be increased so that the corner frequency is correspondingly decreased. A USB specification or other communication protocol may require a minimum frequency to be detected (e.g., a frequency associated with short ping signals). Therefore, the lowering of the corner frequency is limited by the need to comply with the minimum frequency.

Yet another limitation of the analog approach is that analog filters need to balance detection time and noise tolerance. While waiting for a steady state response, detection errors may occur during a transient phase. For example, a short LFPS pulse may not reach an expected amplitude, so that setting of an appropriate detection threshold may be difficult.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Embodiments of the present invention relate to pre-processing a differential input signal using analog comparators, sampling the outputs of the comparators to form a plurality of digital signals, and preparing the digital signals for analysis by an LFPS-detecting digital filter.

Embodiments of the present invention relate to an anti-aliasing sampler, referred to herein as an "activity sampler", for sampling digital signals. The activity sampler includes digital sampling elements such as flip-flops or latches. The activity sampler is configured to minimize aliasing of the digital signals by extending a sampling period using back-to-back sampling elements. Various implementations of the back-to-back configuration are possible and will be described. In some embodiments, digital logic and timing elements (e.g., delay buffers or inverters) may be used to reduce the incidence of related timing issues such as "blind spots" (where individual sampling elements cannot observe the input) and pulse extensions (where the input is carried over to a subsequent sampling cycle).

Embodiments of the present invention relate to a digital filter that implements a plurality of rules that check for the presence or absence of an LFPS. The rules may be configured to detect non-LFPSs, such as high-frequency or idle signals. In an embodiment, the digital filter includes a state machine that transitions between states depending on results of applying the rules to an input signal.

System Overview

Figure 1:
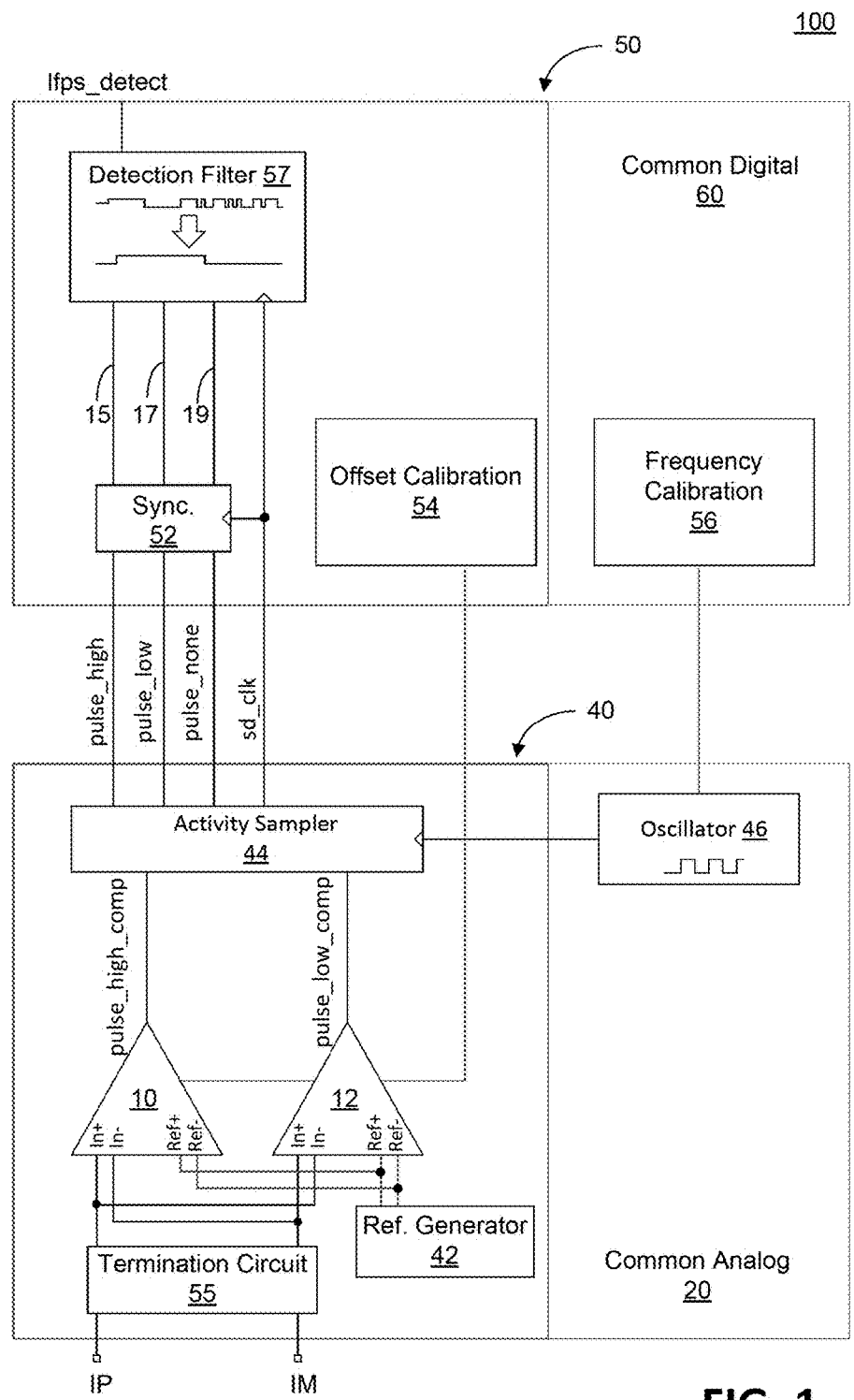
FIG. 1 shows an embodiment of a system for detecting LFPSs.

FIG. 1 is a block diagram of a system 100 for LFPS detection according to an embodiment. The system 100 includes an analog front end 40 and a digital back end 50. The front end 40 receives a differential input signal (IP and IM). The input need not be differential, but the use of a differential input increases the accuracy of the LFPS detection. The front end 40 includes comparison circuitry for each polarity of the input signal, including a threshold comparator 10 with its positive input terminal coupled to the positive polarity input signal IP, and a threshold comparator 12 with its positive input terminal coupled to the negative polarity input signal IM. The negative input terminals of the comparators 10, 12 are coupled to signals that are of opposite polarity to those of the respective positive input terminals.

A reference generator 42 provides a positive reference signal and a negative reference signal to both comparators 10, 12. The difference between the positive and negative reference signals sets the thresholds of the comparators. Comparator 10 asserts pulse_high_comp when the difference of IP minus IM is above the threshold of comparator 10, while comparator 12 asserts pulse_low_comp when the difference of IP minus IM is below the threshold of comparator 12. IP and IM are optionally connected to a termination circuit 55, which may include termination resistors and coupling capacitors.

The electrical characteristics of LFPSs may be defined by communication protocol. For example, the USB 3.1 specification, revision 1.0 (Jul. 26, 2013) sets forth characteristics such as amplitude, period and maximum allowable duty cycle distortion (which is a timing variance away from 50% duty cycle). Characteristics not directly defined may be inferred, e.g., maximum and minimum duration may be inferred from duty cycle distortion and period. The characteristics help distinguish an LFPS from a data signal or from another signal used in the communication protocol such as an electrical idle signal. Therefore, characteristics of digital signals obtained through sampling LFPSs can be derived. Thresholds used in the front end 40 and detection rules used in the back end 50 (the rules will be described in detail below) may be set based on these derived characteristics.

The front end 40 may include an activity sampler 44 and a clock (oscillator 46). The activity sampler 44 processes the outputs of the comparators 10, 12 to produce digital signals (pulse_high, pulse_low, and pulse_none), which are input to the back end 50. Pulse_high is driven by the sampler 44 to indicate that in the previous clock cycle (not the current cycle), the differential input signal was above a positive threshold required for the input signal to be considered a valid LFPS, i.e., pulse_high is asserted when pulse_high_comp was asserted in the previous cycle. Pulse_low is driven by the sampler 44 to indicate that in the previous clock cycle, the differential input signal was below a negative threshold which a valid LFPS should not fall below, i.e., pulse_low is asserted when pulse_low_comp was asserted in the previous cycle. Pulse_none is driven by the sampler 44 to indicate that in the previous clock cycle, the differential input signal was in between the positive and negative thresholds. Pulse_none may be generated by inverting pulse_high_comp and pulse_low_comp, sampling them with the activity sampler, then applying the sampled signals to an AND gate. Pulse_none can indicate the absence of an LFPS, the presence of high-speed data, or a transition between LFPS levels.

Oscillator 46 generates a periodic clock signal and may be part of a set of analog circuits 20, which are shared by other circuits. The activity sampler 44 may derive a synchronizing signal (sd_clk) from the oscillator 46.

The back end 50 may include an optional synchronizer unit 52 that synchronizes pulse_high, pulse_low, and pulse_none (collectively referred to herein as "pulse_x") signals) based on sd_clk, to form corresponding signals, which are respectively labeled 15, 17, and 19 in FIG. 1. Although the pulse_x signals are generated by the activity sampler using the same clock, and are thus synchronous, the synchronizer unit 52 may re-synchronize the pulse_x signals on the same clock in order to remove metastability. In this regard, the synchronizer may be viewed as a gain stage that ensures signals which rise at approximately the same time are correctly aligned relative to one another. The synchronizer unit 52 may be implemented using flip-flops. It should be noted, however, that the synchronizer is not always needed, as the back end 50 may be designed with a built-in tolerance to accommodate cases where the clock reference of the activity sampler is very close to a transition of either pulse_low_comp or pulse_high_comp, and where normal timing variations within the back end circuit cause a sampling difference between the pulse_x outputs versus their ideal values.

The back end 50 may include calibration components, such as an offset calibration unit 54 that calibrates voltage offsets of the comparators 10, 12, and a frequency calibration unit 56 that adjusts the frequency of the oscillator 46. The frequency calibration unit 56 may be part of a set of digital circuits 60, which are shared by other circuits.

The signals 15, 17, 19 may be input to at least one digital filter, including an LFPS detection filter 57. The LFPS detection filter 57 processes the signals 15, 17, and 19 to detect the presence or absence of an LFPS, and asserts high a signal "lfps_detect" when an LFPS is detected. The lfps_detect signal is asserted low when a non-LFPS signal is detected, such as, when an absence of an LFPS is detected. In general, it is much more difficult to detect the absence of an LFPS than the presence of an LFPS. Therefore, the detection of a single, non-ubiquitous, non-LFPS feature may take precedence over the detection of preceding LFPS features, such that detection of a non-LFPS feature will reset the detection cycle with respect to detecting an LFPS. The filter 57 may include a state machine and other digital logic that implements rules for detecting LFPSs and/or non-LFPSs. Rules for detecting an LFPS are described below. In addition to detecting the presence or absence of an LFPS, it is possible to configure a filter to detect the presence of other types of signals using one or more of the pulse_x signals.

Figure 2A:
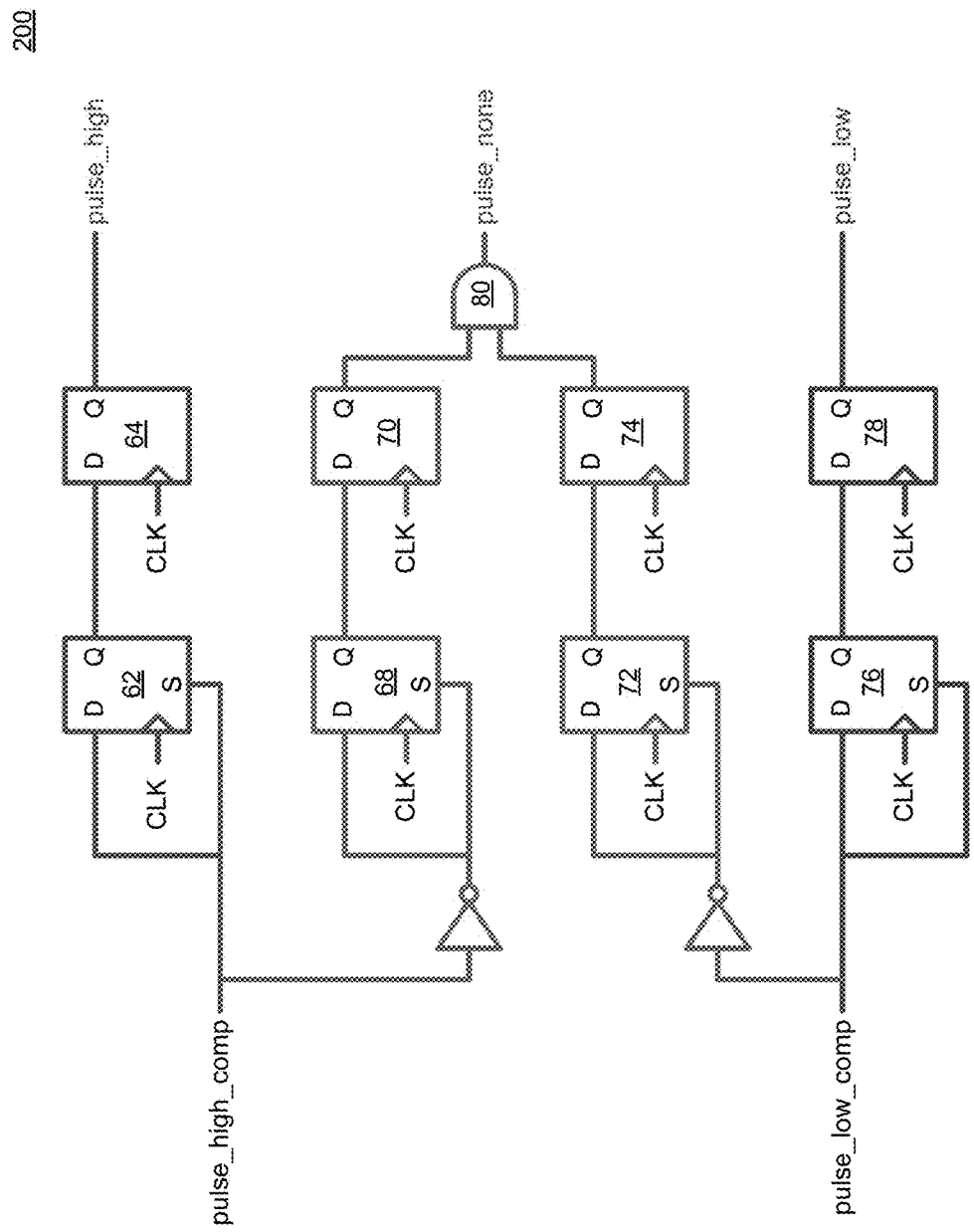
FIG. 2A shows an embodiment of a sampling circuit.

FIG. 2A shows an example circuit 200 for generating pulse_high, pulse_low and pulse_none. Pulse_high is generated by inputting pulse_high_comp to the data input (D) and the set input (S) of flip-flop 62, which outputs to flip-flop 64. Pulse_low is generated by inputting pulse_low_comp to the D input and the S input of flip-flop 76, which outputs to flip-flop 78. Pulse_none is generated by an AND gate 80. A first input of gate 80 is formed by inverting pulse_high_comp and sending the result to the D input and the S input of flip-flop 68, which outputs to flip-flop 70. A second input of gate 80 is formed by inverting pulse_low_comp and sending the result to the D input and the S input of flip-flop 72, which outputs to flip-flop 74. Each of the flip-flops in FIG. 2A is clocked by a signal (CLK), which may correspond to the output of oscillator 46.

Figure 2B:
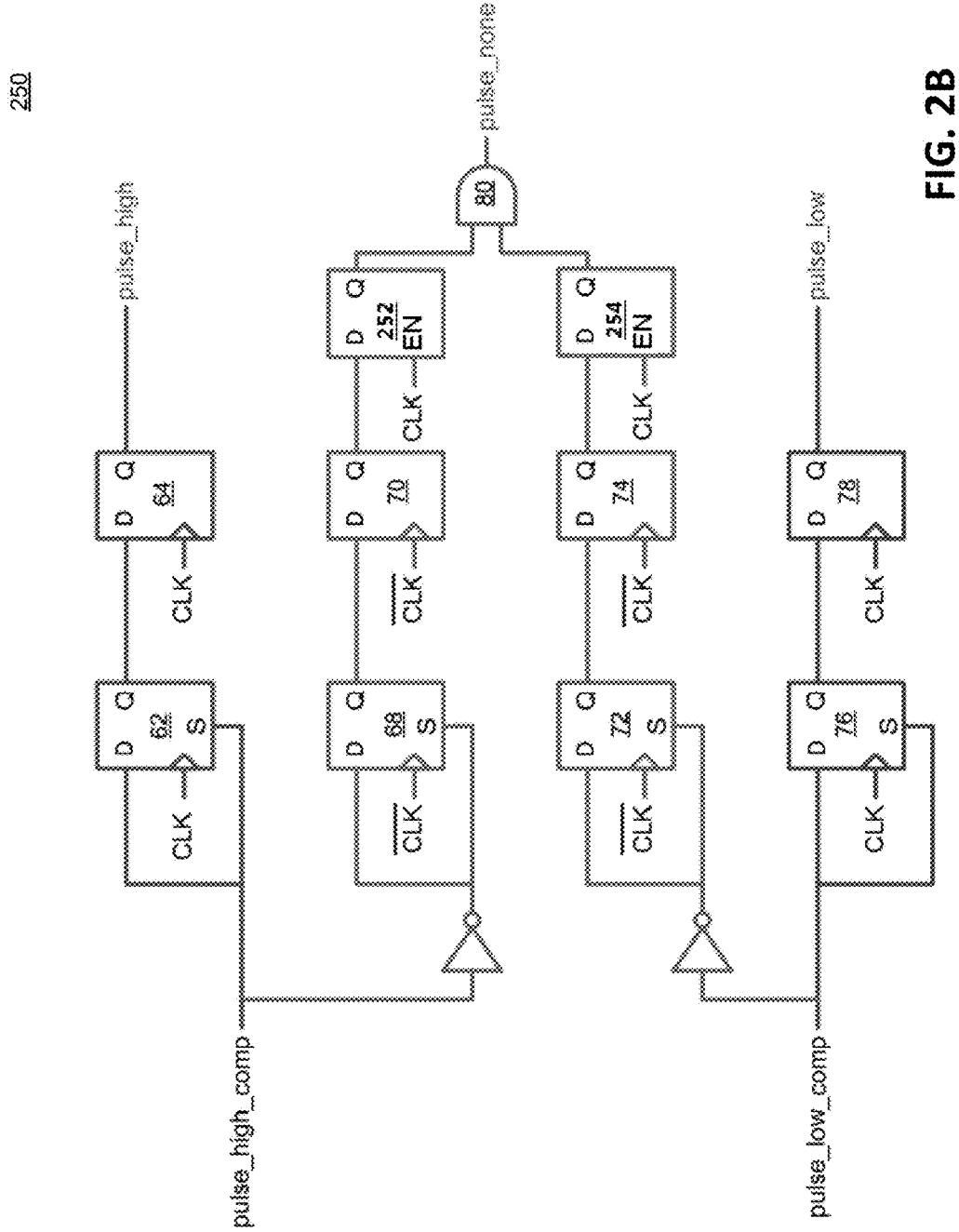
FIG. 2B shows an embodiment of a sampling circuit.

FIG. 2B shows an example circuit 250 for generating pulse_high, pulse_low and pulse_none. The circuit 250 differs from the circuit 200 of FIG. 2A in that the pulse_none samplers (68, 70, 72 and 74) are driven on an inverted CLK signal, and then re-synchronized on the rising edge of CLK by a set of latches 252 and 254. The circuit 250 samples pulse_none with a delay relative to pulse_high and pulse_low, thereby providing a margin for clock alignment mismatch and sampler offsets, so that the digital synchronization between pulse_high, pulse_low and pulse_none can be simplified, with less digital tolerance required. The digital filter should account for possible alignment differences, glitches and noise, for cases where the transition on pulse_high_comp and/or pulse_low_comp happens close to the clock rising edge.

Figure 3:
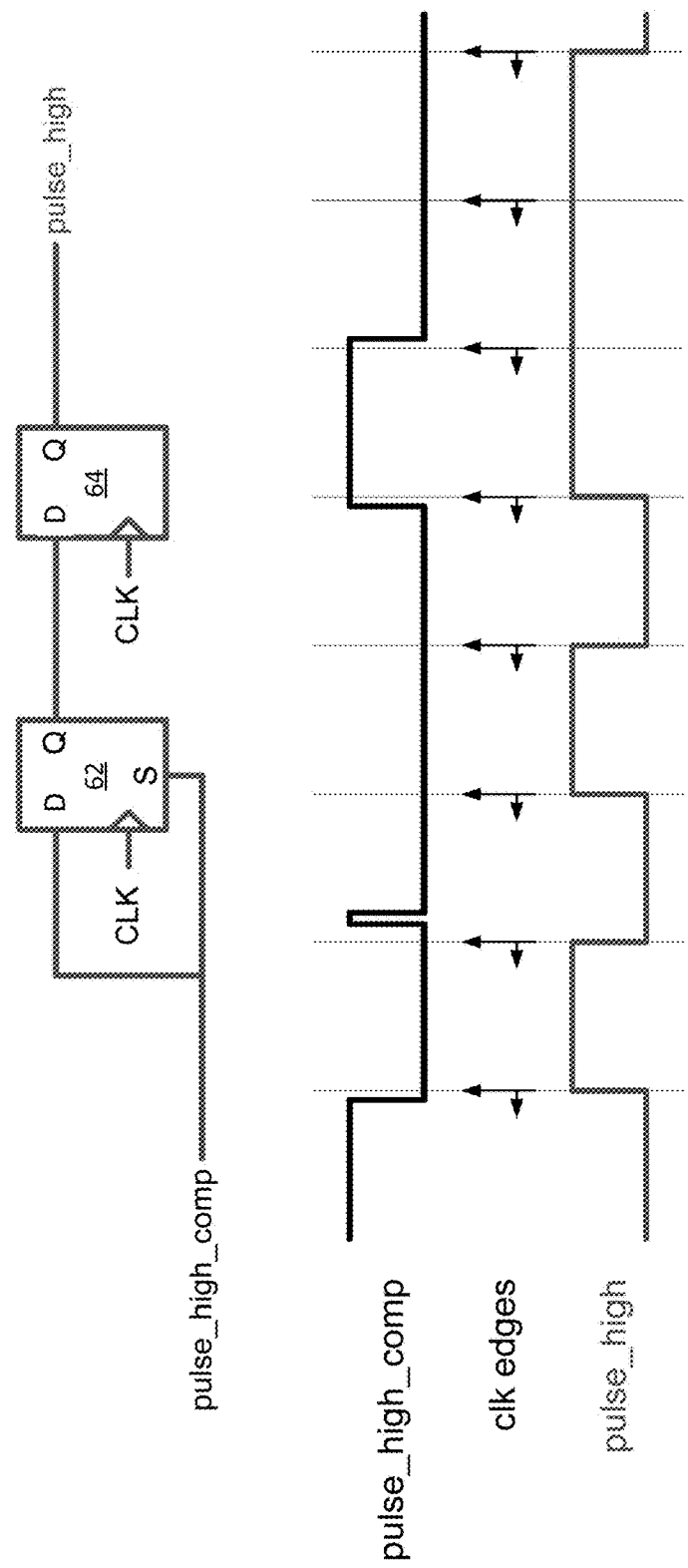
FIG. 3 shows a timing diagram illustrating relationships between inputs and outputs of the sampling circuit of FIG. 2A.

FIG. 3 shows a timing diagram illustrating relationships between pulse_high_comp, the edges of CLK, and pulse_high, as determined by the circuit 200. Similar relationships exist between pulse_low_comp, the edges of CLK and pulse_low. Because of the introduction of a second flip-flop, e.g., flip-flop 64, the output is delayed by one clock cycle.

Figure 4:
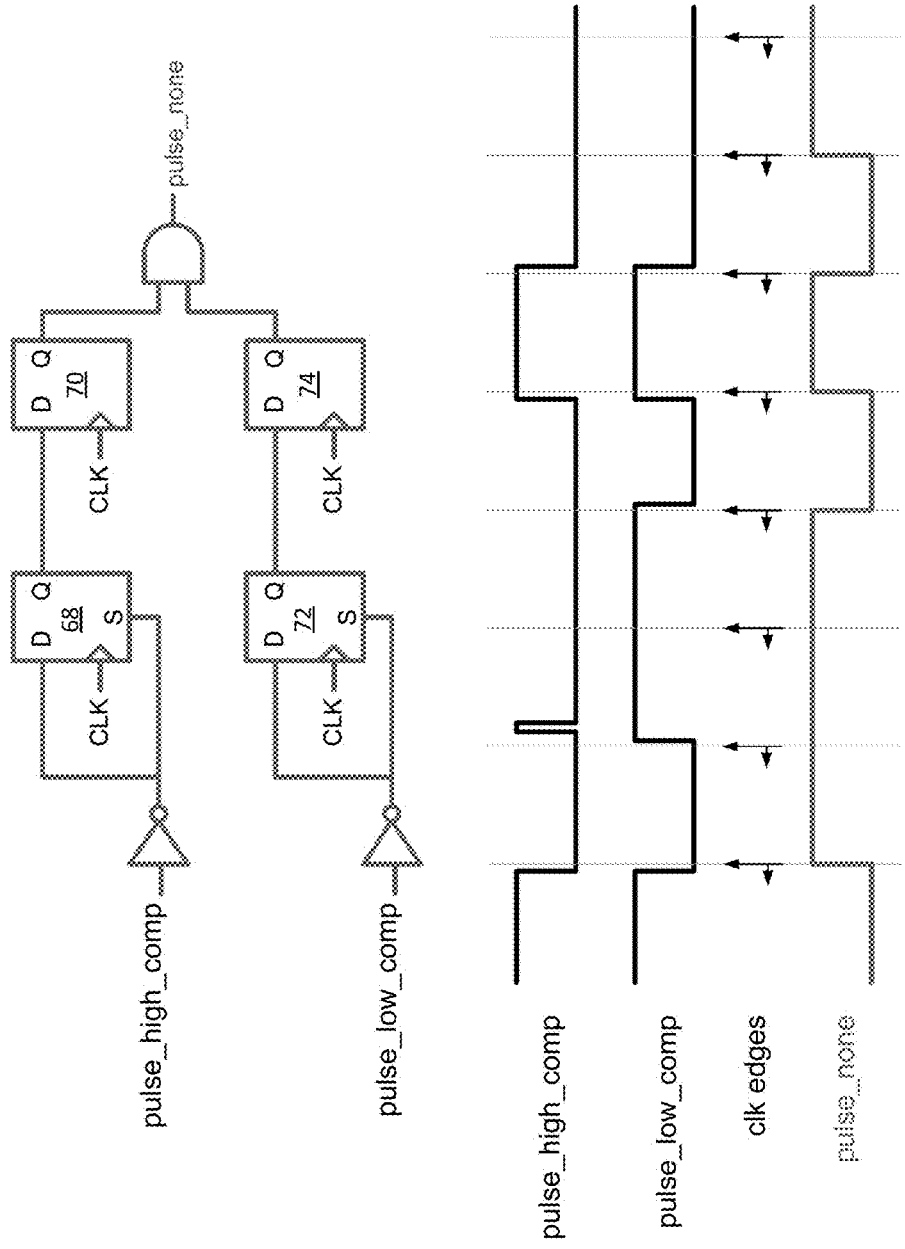
FIG. 4 shows another timing diagram illustrating relationships between inputs and outputs of the sampling circuit of FIG. 2A.

FIG. 4 shows a timing diagram illustrating relationships between pulse_high_comp, pulse_low_comp, the edges of CLK, and pulse_none, as determined by the circuit 200.

Figure 5:
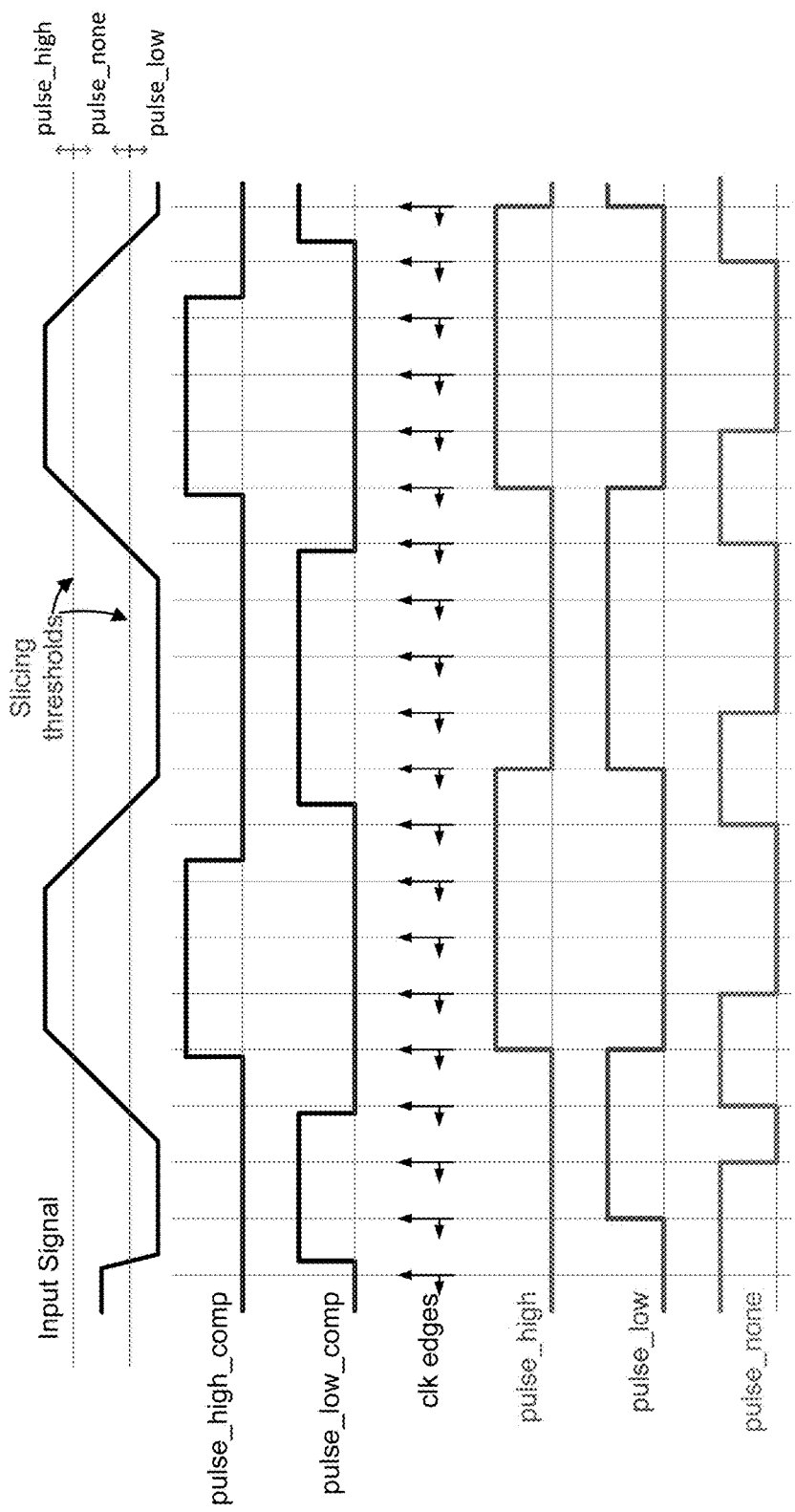
FIG. 5 is a timing diagram illustrating how outputs of the sampling circuit of FIG. 2A change based on an example LFPS.

FIG. 5 is a timing diagram illustrating how pulse_high, pulse_low, and pulse_none change based on an example LFPS. As shown, the earlier noted positive and negative thresholds are essentially slicing thresholds that form three output regions.

Figure 6:
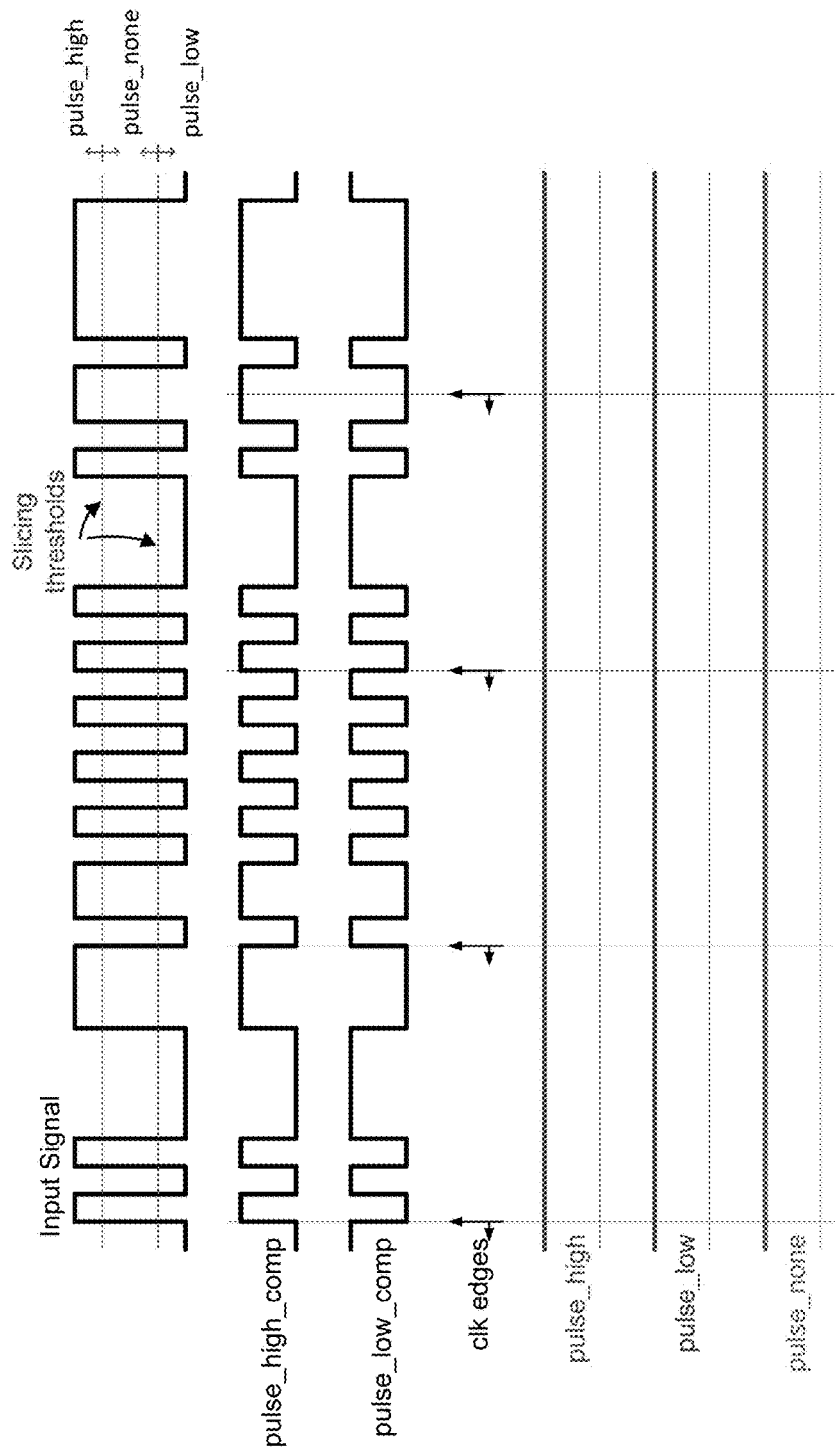
FIG. 6 is a timing diagram illustrating how outputs of the sampling circuit of FIG. 2A change based on an example high-speed data signal encoded using an 8b/10b format.

FIG. 6 is a timing diagram illustrating how pulse_high, pulse_low, and pulse_none change based on an example high-speed data signal encoded using an 8b/10b format.

Figure 7:
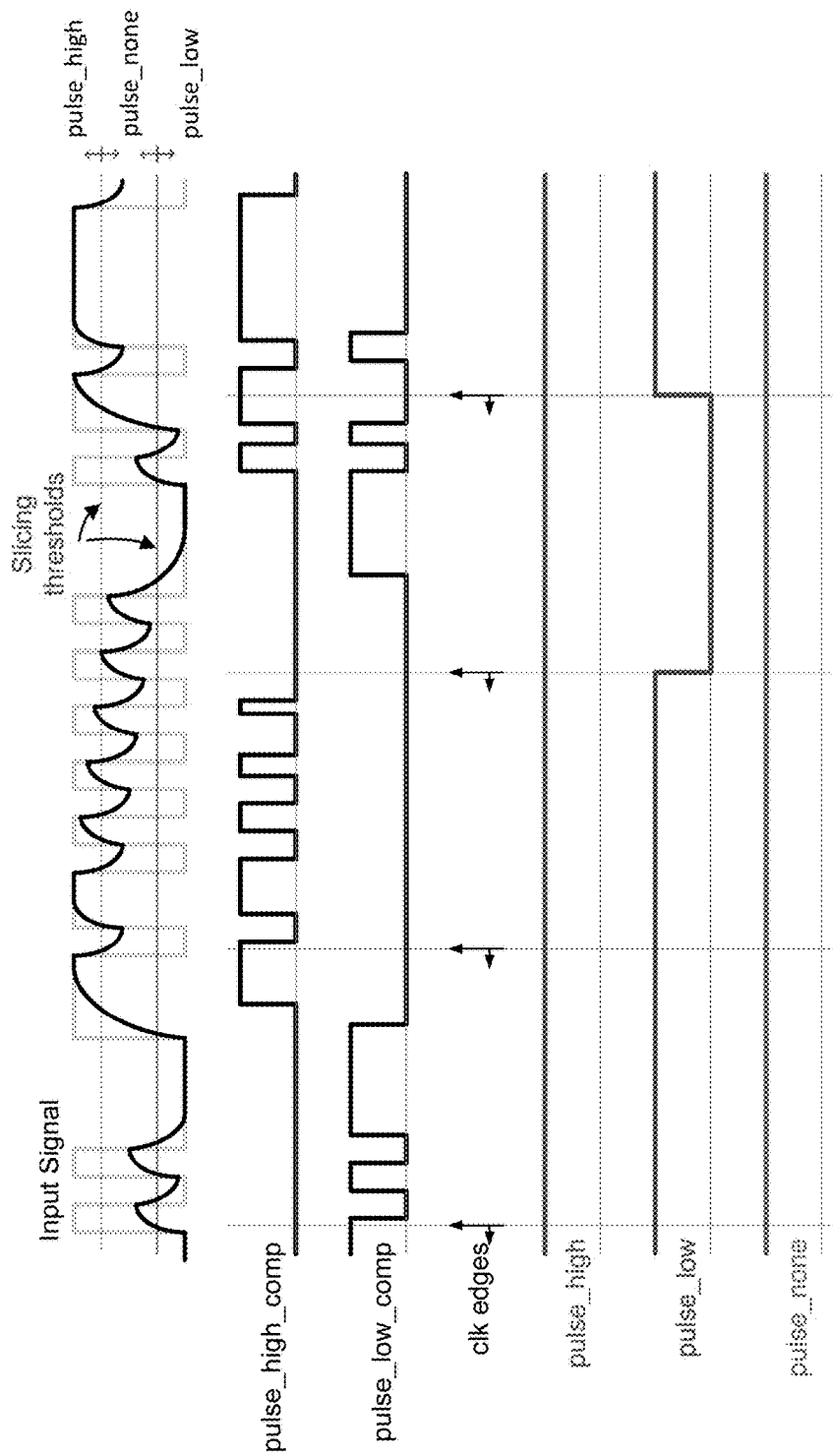
FIG. 7 is a timing diagram illustrating how outputs of the sampling circuit of FIG. 2A change based on example high-speed data signal that is attenuated.

FIG. 7 is a timing diagram illustrating how pulse_high, pulse_low, and pulse_none change based on an example high-speed data signal that is attenuated.

Anti-Aliasing Activity Sampler

In designing the activity sampler, the inventors have considered numerous alternative implementations, with anti-aliasing as a factor for consideration. The following is a discussion of some of these alternatives.

FIG. 3 shows an example sampling circuit, part of example circuit 200. In this embodiment, flip-flop 62 is set by a digital high value on input pulse_high_comp. In an alternate embodiment, the D input of flip-flop 62 could be tied to ground, as the purpose is to reset the output on the rising edge of clock CLK. However, by tying D to the input pulse_high_comp, the operation is improved since delays through the first stage of the flip-flop 62 (internal to flip-flop 62) are equalized between S and CLK, reducing timing periods where a signal will either be reset even though it extends into the current clock cycle (a "blind spot"), or where it will be set even if it finished at the very end of the previous cycle (a "pulse extension"). Flip-flop 64 samples the output of flip-flop 62 and holds the output constant for one full clock cycle, so as to present a synchronous signal to downstream processing logic.

Those skilled in the art will note that timing between the clocks of the first flip-flop 62 and the second flip-flop 64 may be further adjusted and matched to internal delays inside the flip-flops to further reduce the duration of these "blind spot" or "pulse extension" periods. These optimal delays depend upon the detailed implementation of flip-flops 62 and 64, as well as other circuit characteristics, such as routing parasitic capacitance and resistance, and loading effects of downstream logic circuits. The timing between inputs S, D and CLK of flip-flop 62 may also be adjusted.

As mentioned earlier, even though the output of the activity sampler (e.g., the output of flip-flop 64) is synchronous to the clock CLK, the asynchronous nature of the input to the sampler may result in a metastable signal condition. It may be advisable to add more re-synchronizing flip-flops to amplify the output and reduce the probability of such a metastable signal at the input of downstream logic. Ideally, the timing between the pulse_x outputs of circuit 200 and their respective re-synchronizing circuits within circuit 52 should be matched.

Figure 8:
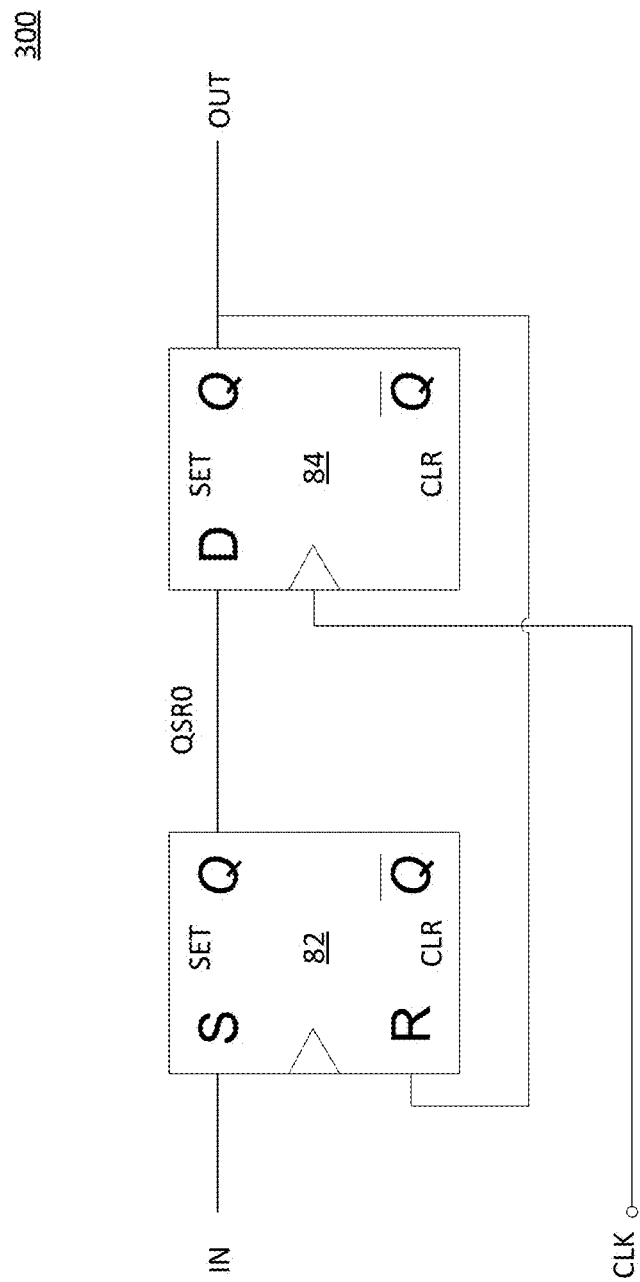
FIG. 8 shows an embodiment of a sampling circuit.

FIG. 8 shows an example sampling circuit 300 that may be used for generating pulse_high or pulse_low, or as a building block for generating pulse_none. Similar to the circuit 200, the circuit 300 includes back-to-back sampling elements. In this instance, the sampling elements comprise an SR latch 82 that outputs to a flip-flop 84. The S input of latch 82 is labeled "IN" and corresponds to pulse_high_comp or pulse_low_comp, or inverted versions thereof. The reset input (R) of the latch 82 is connected to the output of the flip-flop 84. In this manner, the latch 82 holds the value of the input signal until it gets sampled by the flip-flop 84. This reduces aliasing because the input signal need only be asserted long enough during a clock cycle for the Q output of SR latch 82 (labeled "QSR0") to be set, in order for the output OUT to reflect this condition on the next rising edge of the clock. At the end of the cycle (next clock rising edge), the input signal may be back to zero, but the output will remain asserted because QSR0 will stay high until it is reset by the output flip-flop 84.

With the circuit 300, aliasing may still occur when sampling high-frequency data or when sampling at the end of an input pulse. For example, if the output OUT was low initially, the SR latch 82 would record the input IN becoming high. When the SR latch 82 is later reset by the preceding IN high event reaching the OUT output, a subsequent IN high event would not be reflected in QSR0. However, if the subsequent IN high event happens at the end of a CLK cycle, it may still be caught on the next cycle. Therefore, the circuit 300 is generally not sufficient by itself as an activity sampler, but can form the basis for a more robust sampling circuit.

Figure 9:
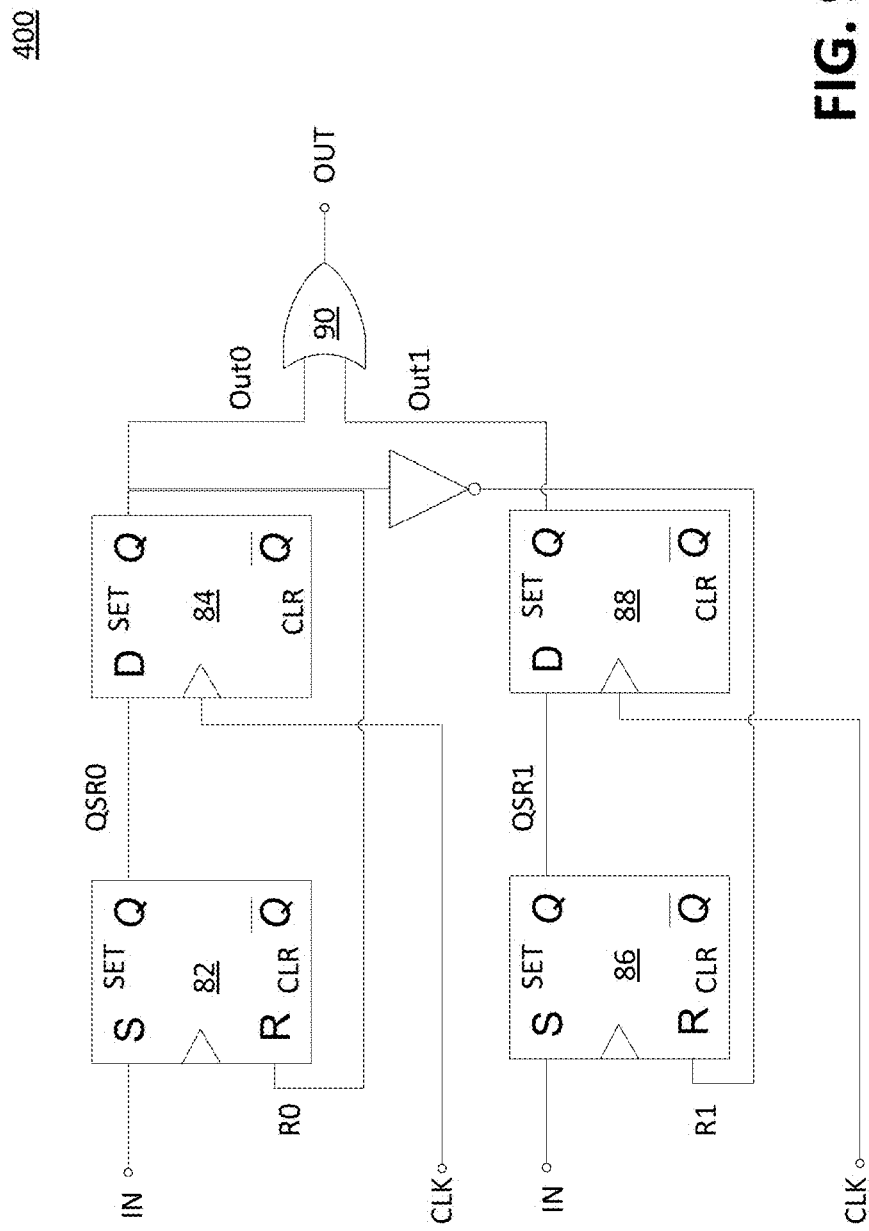
FIG. 9 shows an embodiment of a sampling circuit.

FIG. 9 shows an example sampling circuit 400 with improved anti-aliasing capabilities that solves the above described issues of circuit 300. The circuit 400 includes, as a first set of sampling elements, the SR latch 82 and flip-flop 84, but adds an additional set of sampling elements (SR latch 86 and flip-flop 88) in order to perform sampling while the first set of sampling elements is in a reset state. This is accomplished by providing the SR latch 86 with an inverted reset signal. The outputs of the flip-flops 84, 88 are provided to an OR gate 90.

Figure 10:
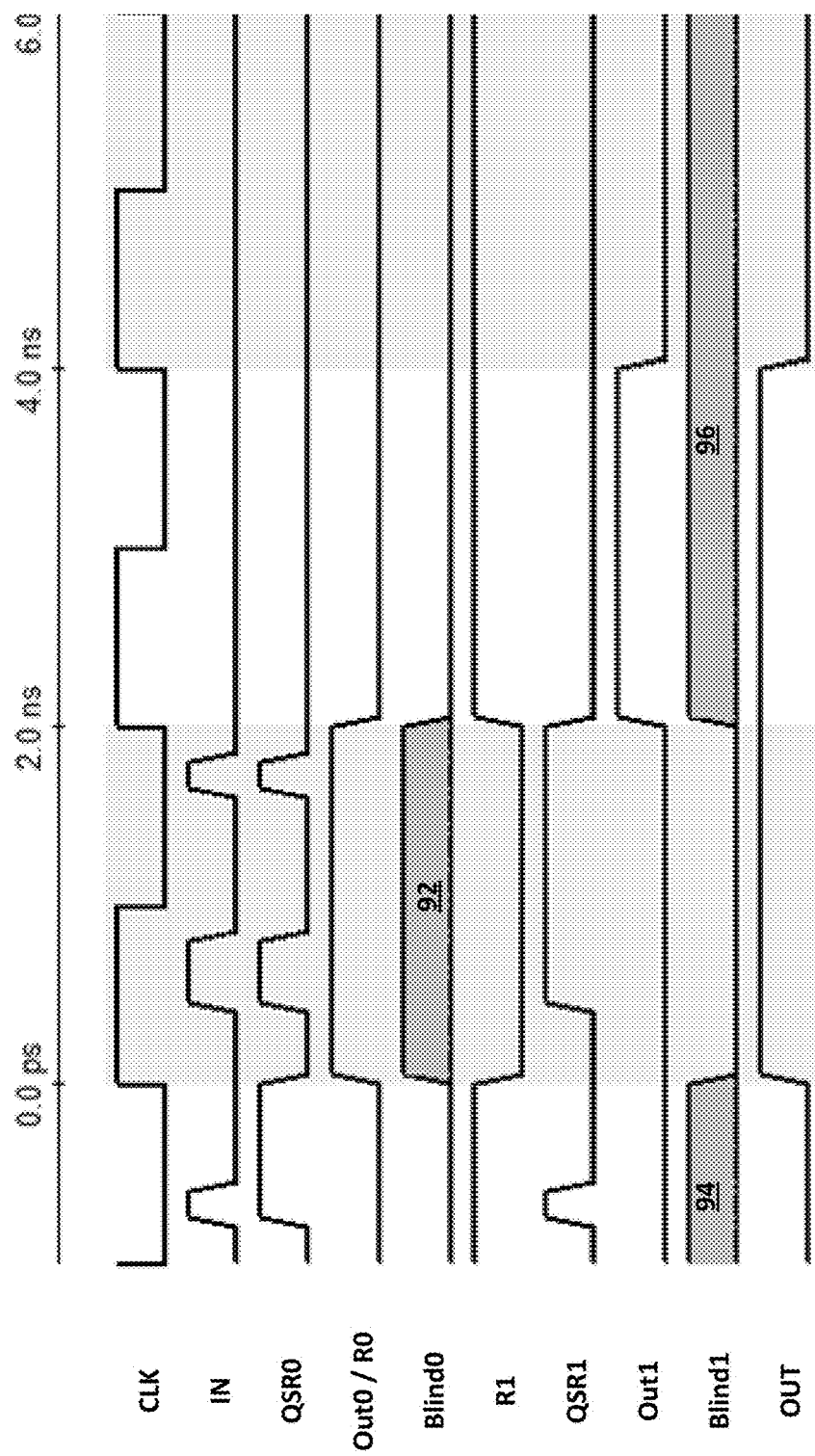
FIG. 10 is a timing diagram for the circuit of FIG. 9.

FIG. 10 is a timing diagram showing the operation of circuit 400. As shown, the first set of sampling elements has a "blind spot" 92 when the latch 82 is in reset (R0 high). However, the latch 86 is active during this time to catch any portion of the input missed by latch 82. Likewise, the latch 86 has blind spots 94 and 96 when in reset (R1 high), but is covered by latch 82 during these times. By staggering the reset times of a plurality of sampling elements, the sampling circuit 400 prevents aliasing, as it is then capable of observing the input signal at any given period. Aliasing is prevented because the sampling circuit 400 memorizes whether the input exceeded the threshold, even if the threshold was exceeded for less than the sampling clock's period. However, blind spots can emerge due to having to reset the sampling elements to prepare them for the next clock period.

The presence of blind spots is problematic when the input signal is high-frequency, and can lead to false positive or false negative detections.

As any reset signal needs time to take effect, using two sets of cascaded sampling elements removes the above-noted blind spots. This however introduces the possibility of a false extension of the input, for cases where an input pulse happens to end right at the end of a sampling period. Although the input pulse should only be seen by one set of sampling elements (one SR latch plus its associated flip-flop), in such cases the input pulse could be seen by both sets of sampling elements because of slight timing variations between their respective clocks. Additionally, blind spots may still appear, e.g., when the delays of the latches 82, 86 or the setup times of the flip-flops 84, 88 are taken into consideration. Indeed, it may be difficult to completely eliminate blind spots or extended outputs (pulse extensions), even with appropriate timing corrections. However, with knowledge of the characteristics of LFPSs and non-LFPSs, in addition to knowledge of the behaviors of the sampling elements, the person of ordinary skill in the art should be able to adapt the embodiments, based on the teachings discussed herein, to eliminate most instances of aliasing, missed pulses due to blind spots, or extended outputs. The circuit in FIG. 3 has a similar behavior, performed with fewer elements. The reduction of blind spots and extension periods is achieved through timing adjustments, carefully matched to relevant internal delays, setup times and hold times.

Figure 11:
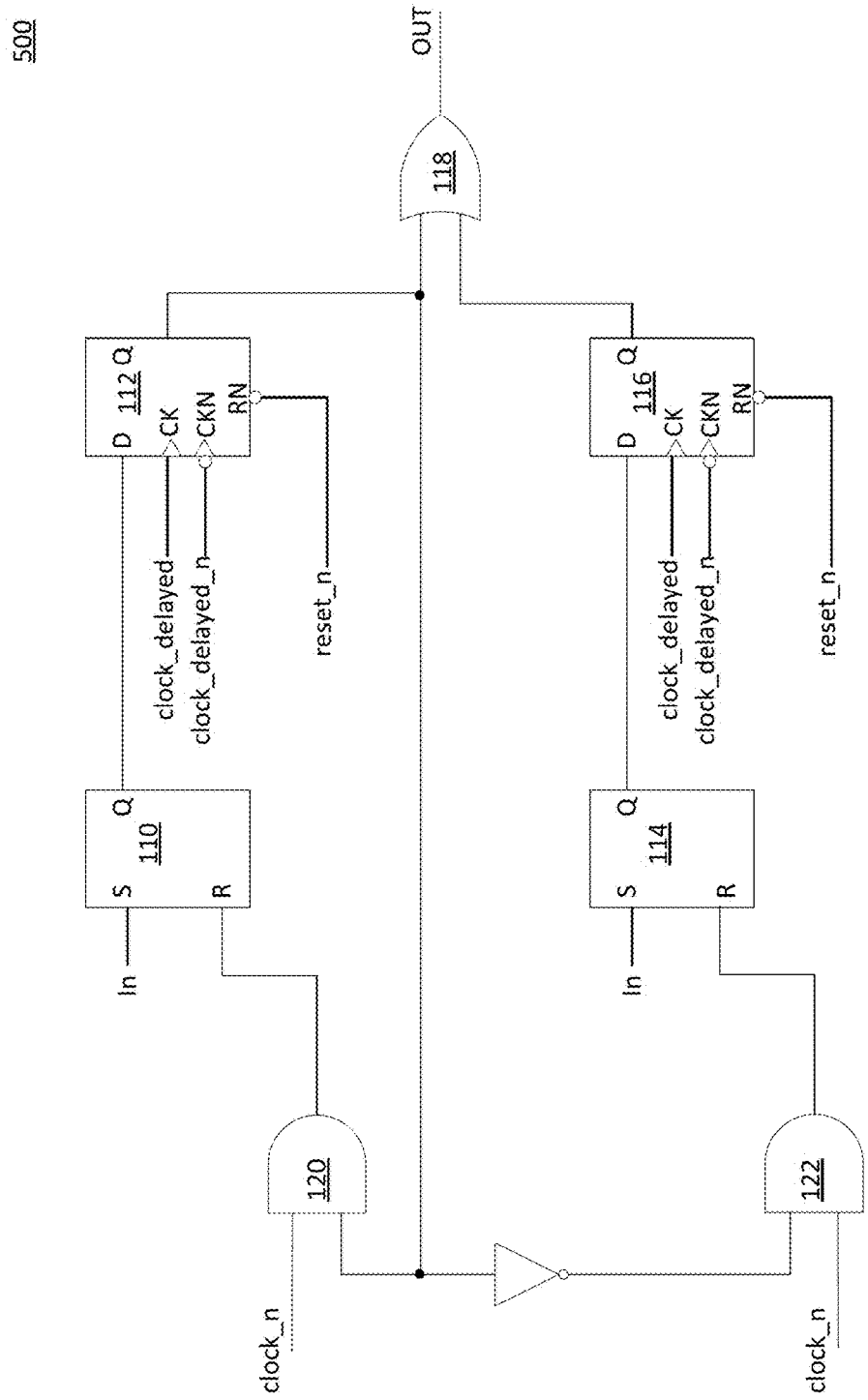
FIG. 11 shows an embodiment of a sampling circuit.

FIG. 11 shows an example sampling circuit 500 with an SR latch 110 outputting to a flip-flop 112, and an SR latch 114 outputting to a flip-flop 116. The outputs of the flip-flops 112, 116 are applied to an OR gate 118. The circuit 500 adds an additional clock (clock_n) to gate the reset inputs of the latches. The reset input of latch 110 is controlled by an AND gate 120. The reset input of latch 114 is controlled by an AND gate 122. Clock_n is an input to both AND gates 120, 122. However, the output of flip-flop 112 forms an input to AND gate 120, while the inverted output of flip-flop 112 forms an input to AND gate 122. Delayed versions of clock_n are supplied to clock inputs of the flip-flops 112, 116 to account for the delay of AND gates 120, 122. Signals clock_delayed_n and clock_delayed are delayed versions of clock_n and its complement, respectively. The addition of the AND gates 120, 122 and the clock_n signal makes it easier to control blind spots and extension periods independently. However, attention should be paid to the timing of the reset inputs of elements 110, 112, 114 and 116, as gating the resets too early may result in a pulse extension. On the other hand, gating the resets too late may result in a blind spot.

Figure 12:
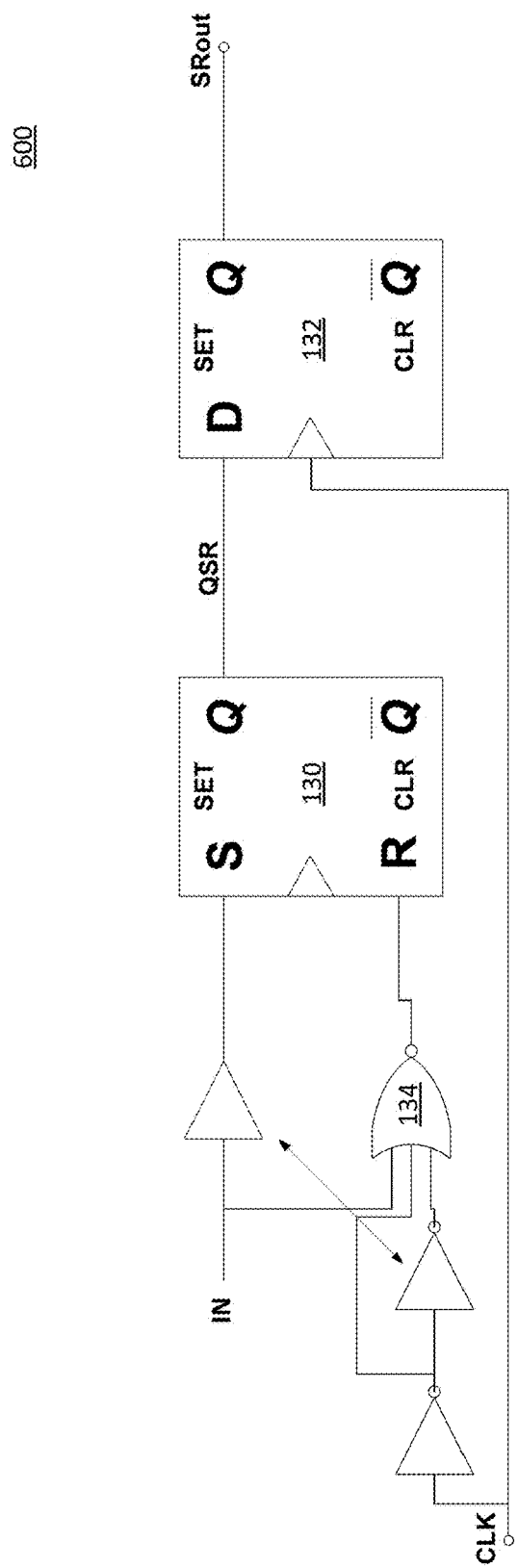
FIG. 12 shows an embodiment of a sampling circuit.

FIG. 12 shows an example sampling circuit 600 with an SR latch 130 outputting to a flip-flop 132. The flip-flop 132 is controlled by a clock signal (CLK), which also generates a short reset pulse for latch 130, via a NOR gate 134 whose inputs include a buffered version of CLK, an inverted version of CLK, and the input signal IN. The delay of the reset pulse is matched, via inverters, to the delay of the input signal into the S input of latch 130, e.g., pulse_high_comp or pulse_low_comp.

Figure 13:
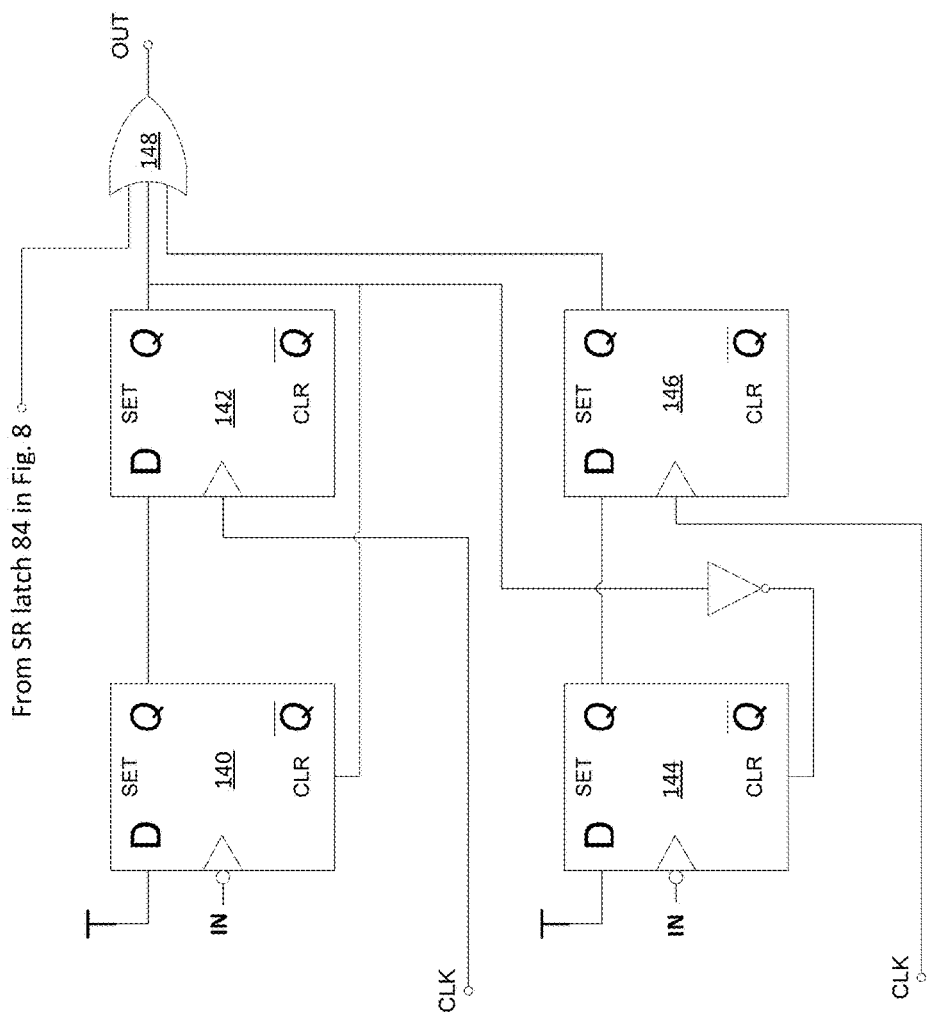
FIG. 13 shows an embodiment of a sampling circuit.

FIG. 13 shows an example sampling circuit 700 which operates as a falling edge detector. The circuit 700 may be used in combination with the circuit 300 and includes a first falling edge detector comprising a flip-flop 140 outputting to a flip-flop 142, and a second falling edge detector comprising a flip-flop 144 outputting to a flip-flop 146. The clear inputs (CLR) of flip-flops 140 and 144 are complementary so that when one falling edge detector is in reset, the other falling edge detector is sampling. The D inputs of the flip-flops 140, 144 are tied to digital 1. The output of circuit 700 is formed by an OR gate 148 that operates on the outputs of flip-flops 142 and 146. In addition, the OR gate 148 processes the OUT output of the circuit 300 in FIG. 8, in order to remove its blind spot. If there is a short input pulse on IN during a first cycle, the SR latch is "blind" on the next cycle. If, for example, a falling edge occurs on this second cycle, the circuit 700 will correctly supplement the blind spot. However, if the input signal was already low at the start of this second cycle, a rising edge during the next cycle, with no falling edge, will be caught as long as the SR latch 82 is configured to give priority to its Set input (IN) over its Reset input (the Q output of flip-flop 84).

In an alternative embodiment, the system may not produce or make use of the pulse_none signal. Instead, the presence or absence of an LFPS may be detected solely based on pulse_low and pulse_high. In such an embodiment, pulse_low and pulse_high may be generated in a manner similar to that described earlier in connection with FIG. 2A, except that pulse_low and pulse_high may only be output when their corresponding threshold conditions are satisfied for the entire duration of a sampling period. The circuit in FIG. 17 is an example of this alternative embodiment.

Figure 17:
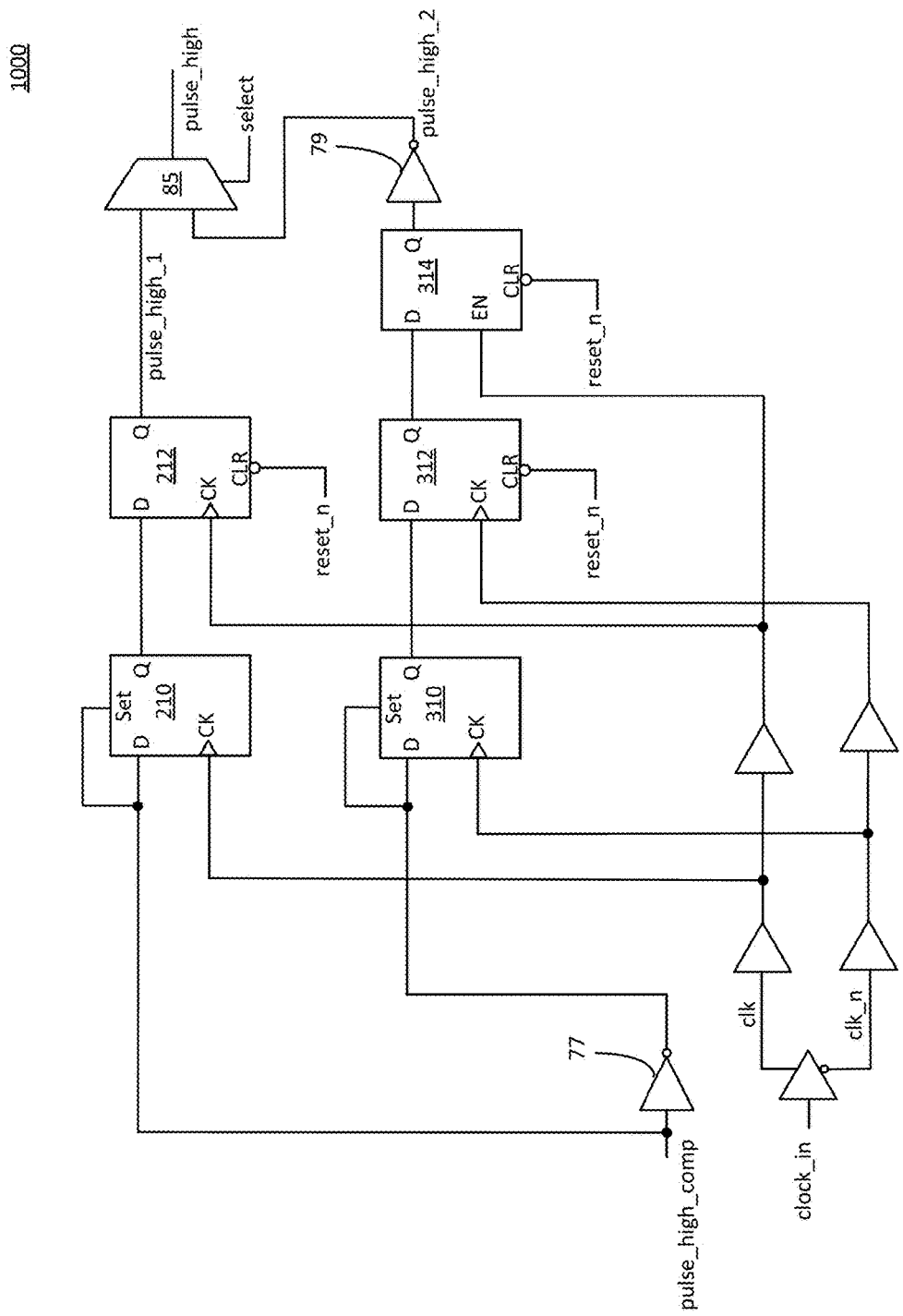
FIG. 17 shows an embodiment of a sampling circuit.

FIG. 17 shows an embodiment of a sampling circuit 1000 that provides alternative circuit paths for generating pulse_high. Analogous circuitry for generating pulse_low has been omitted for simplicity. Using the circuit 1000 and the analogous pulse_low circuitry, pulse_high and pulse_low can be generated for detection without producing pulse_none. In FIG. 17, a "pulse_high_1" signal is generated by a first path including a sampling flip-flop 210 connected to a flip-flop 212. The D and Set inputs of the flip-flop 210 are connected to pulse_high_comp. Flip-flop 210 is clocked by a buffered version of a clock signal "clk", which itself is a buffered version of an input clock "clock_in". The clock_in signal may correspond to the output of oscillator 46 in FIG. 1. The buffered clk signal is further buffered to provide a clock input to flip-flop 212. This is essentially the same circuit shown in FIG. 3. Extra buffering is optional but may improve performance by reducing blind spots and/or extension periods.

A second path includes a flip-flop 310 connected to a flip-flop 312 and a latch 314 to generate a "pulse_high_2" signal. The D and Set inputs of the flip-flop 310 are connected to an inverted version of pulse_high_comp produced by an inverter 77. The flip-flops 310 and 312 are clocked by an inverted version "clk_n" of the clock_in signal. The clk_n signal is buffered once to produce a clock input to flip-flop 310, and buffered again to produce a clock input to flip-flop 312. The latch 314 is an optional element with an enable input connected to the twice-buffered clk signal so that the latch 314 produces its output on the same clock edge as flip-flop 212. The pulse_high_2 signal is produced by an inverter 79 connected to the output of latch 314. The clear inputs of the flip-flops 212 and 312 and the latch 314 are controlled by an enable signal "reset_n".

Either pulse_high_1 or pulse_high_2 may be used as pulse_high. The selection of which path to use can be programmed into a register (not shown) that provides a control signal "select" to a multiplexer 85 into which pulse_high_1 and pulse_high_2 are input. Those skilled in the art will recognize that the embodiment of FIG. 17 has been designed, in part, by re-using circuit elements that generate pulse_none in FIG. 2B, including sampling elements in the second path that are driven on a clock polarity opposite to that of the sampling elements in the first path. However, the clock inversion is not necessary in this case, so the first and second paths could be driven on the same clock, removing the need for latch 314.

The digital detection filter described in the next section can be modified for use in combination with the embodiment of FIG. 17. For example, many sampling circuit implementations that omit pulse_none will function properly together with the digital filter by simply tying down the pulse_none input of the digital filter and slightly adjusting the decision parameters of the digital filter to account for the different conversions between the analog pulse_x_comp signals and their digital pulse_x versions.

Digital Detection Filter

A digital filter may be configured to detect the presence or absence of an LFPS (e.g., filter 57). Likewise a digital filter may be configured to detect the presence or absence of any other type of signal. The digital filter may process the above-noted pulse_x signals, measure their characteristics, and compare the characteristics to LFPS specifications. Given a set of rules, the digital filter may declare whether the input signal is an LFPS or not. Detection in the digital domain may be subject to two type of errors: false positives (detection of an LFPS during normal high-speed data transmission) or false negatives (failure to detect a valid LFPS). Since an LFPS is a well-defined, slow signal, false negatives are easier to avoid. Noisy or truncated LFPSs could, however, result in shortened detection, which should be avoided, especially for short ping LFPSs that typically last only two cycles.

False positives are more difficult to avoid. The USB 3.1 specification has two transmission rates that may be of interest: 5 Gb/s and 10 Gb/s. Transmission at 5 Gb/s uses 8b 10b encoding, which reduces the maximum number of consecutive identical digits (CIDs). Thus, with a sufficiently fast comparator and sampling period, it is possible to prevent false positives. However, at 10 Gb/s, the encoding scheme allows more CIDs. The faster speed could also mean more ISI, so spurious detection of LFPS could occur due to a high-speed data pattern that sufficiently resembles an LFPS. Such spurious detections can be removed by a filter at a higher level. Such a filter would require that the LFPS indication be held for a sufficient duration. Non-LFPS signals that would satisfy this additional criterion would be extremely unlikely to happen.

The activity sampler in the front end may include many sampling circuits that provide data to the digital filter. Each of these sampling circuits can have a slight skew versus the others. Thus, even if their sampling windows were perfect (no blind spot or pulse extension), two sampling circuits may not see exactly the same signal, and could report results shifted relative to one another if an input transition occurs close to a sampling instant. This requires the digital filter to allow some types of patterns which could also be caused by non-LFPSs. For example, when the input quickly transitions from high to low, the digital inputs may, for one or even two cycles, indicate that both pulse_high and pulse_low are active. The digital input pattern could have been the same going from a low-frequency pattern (e.g., a long string of digital 1's), through a high-frequency burst lasting less than 1 cycle, and then to a long string of digital 0's.

The more rules that are implemented in the digital filter, the less likely a false positive LFPS detection will occur. The following is a non-exhaustive list of parameter definitions and corresponding rules that the inventors have discovered as being suitable for use in a digital filter.

Possible High-frequency (PHF) is a condition identified when pulse_high_sync and pulse_low_sync are both driven active.

Extended Transition (ET) is an LFPS transition that produces a two-cycle overlap of pulse_high_sync and pulse_low_sync. This is a rare case that can only occur for very fast transitions, where the sampling delay between the samplers producing pulse_high and pulse_low is larger than the transition time.

Embedded Pulse (EP) occurs when high frequency data is being received where one of the pulse signals (high or low) is currently active, and during this time, the opposite pulse signal is driven active and inactive, e.g., a pulse_high that starts at or after a pulse_low, and ends before pulse_low. Embedded pulses are rejected from being considered possible LFPSs.

Minimum Distance (MD)—The measured distance between two consecutive rising edges on pulse_high or pulse_low should be greater than or equal to MD cycles (counting ET as one cycle) for a signal to be considered a possible LFPS. The tests for pulse_high and pulse_low are independent. PHF events can also trigger the start of the MD count. If both polarities rise at the same time at the end of the MD count, then the signal is not an LFPS.

Minimum Pulse (MP)—The duration of a pulse on pulse_high or pulse_low should be greater than or equal to MP cycles (counting ET as one cycle) for a signal to be considered a possible LFPS. PHF events can also trigger the start of the MP count. The MP tests for pulse_high and pulse_low are independent. MP failures don't restart the other polarity's MD and MP counts if they may have been from a truncated pulse, i.e., the count started on both pulse_high and pulse_low rising or on PHF.

High-frequency (HF)—A high-frequency condition is identified when a PHF condition happens outside of an LFPS transition.

No signal (NS)—is a condition identified when pulse_high_sync and pulse_low_sync are both driven inactive (de-asserted) for longer than NS cycles. The maximum number of cycles with neither pulse_high nor pulse_low should be less than or equal to NS cycles for a signal to be considered a possible LFPS.

Ramp-down (RD)—An output signal indicating that an LFPS is detected (lfps_detect) should be kept asserted for RD cycles after the last valid active signal (e.g., from the fall of the LFPS, not after detecting a failure), in order to prevent distortion of the lfps_detect signal. This compensates for the latency created due to waiting for the MD count to be satisfied before asserting lfps_detect. During ramp-down, the MD and MP counts cannot restart. After ramp-down, a rising edge is required to start the MD count.

The overlap of pulse_high or pulse_low should be less than or equal to two cycles for a signal to be considered a possible LFPS, unless: (1) MP is not fulfilled and we are not on the first two cycles after a rising edge (then a single HF is a non-LFPS pattern); or (2) we are on the second cycle after a rising edge (then the signal could still be an LFPS if MP is fulfilled on the next cycle and it is a falling edge).

Pulse_none should be de-asserted for at least one cycle between two consecutive rising edges of pulse_high for a signal to be considered a possible LFPS. The same rule applies for pulse_low.

For a signal to be considered a possible LFPS, pulse_none can only be asserted, in order of precedence: (1) during a high-frequency signal, except during the first cycle of an ET, unless there was a rising edge on the same polarity one cycle before the ET; (2) during the first and second cycles after a rising edge on pulse_high or pulse_low; and (3) during the cycle before a falling edge on pulse_high or pulse_low.

Additionally, after a rising edge on one polarity, the digital filter should start counting rising edges on the other polarity. If there is a true rising edge on the other polarity before the MD count finishes, then the digital filter should reset the current MD count (or restart the MD count if the signal is still high, then restart MP). The MD count on the other polarity should likewise be reset.

Figure 14:
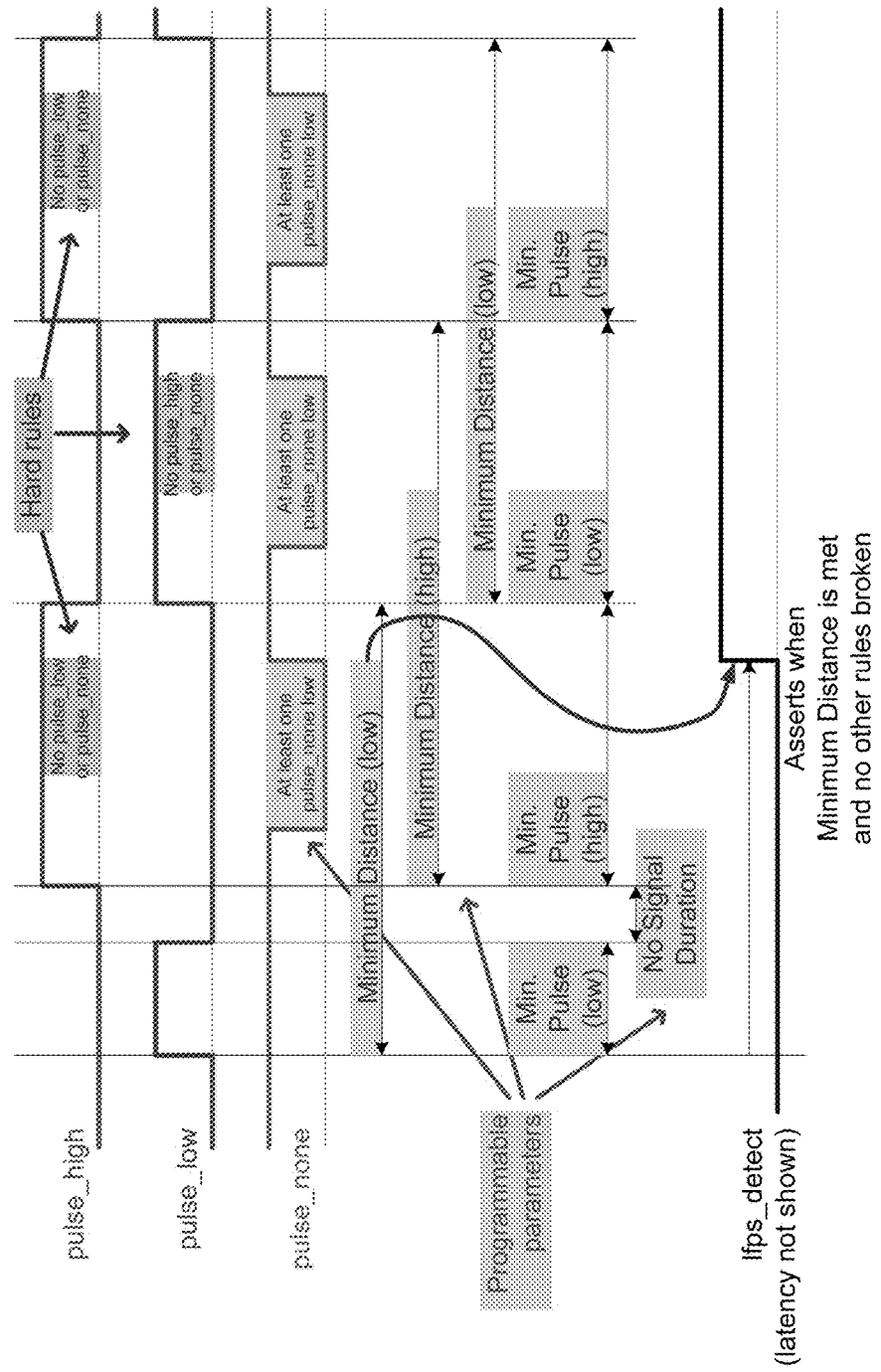
FIG. 14 is an annotated timing diagram containing timing criteria, as applied to a valid LFPS.

FIG. 14 is a timing diagram illustrating some of the above mentioned rules being applied to an input signal representing a valid LFPS. For instance, the requirements concerning overlap between pulse_low or pulse_high and other pulse_x signals may form "hard rules" that, if violated, immediately rule out the possibility of an LFPS. Other rules, such as the de-assertion of pulse_none for at least one cycle between two consecutive rising edges of pulse_high, detect the possible existence of an LFPS. A circuit designer may choose to combine multiple rules so that the filter has to detect a certain number or certain specific types of LFPS characteristics before an LFPS is declared (e.g., MD is met and no other rules have been broken). Certain parameter values, such as MP, MD and NS, may be user programmable or programmed at the time of manufacture.

Figure 15:
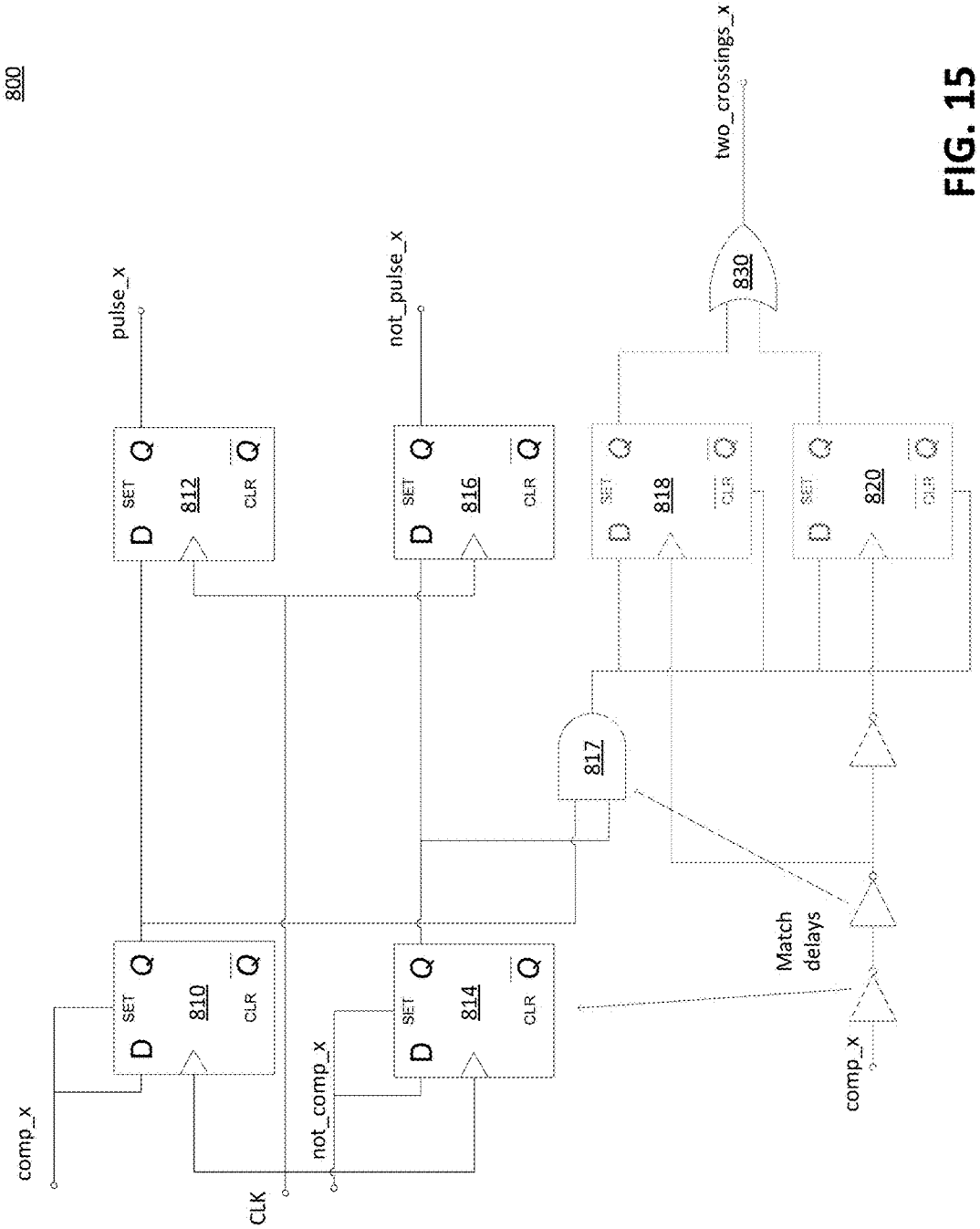
FIG. 15 shows an embodiment of a sampling circuit.

Other rules besides those mentioned may be used, depending on what types of information the activity sampler provides to the digital filter. FIG. 15 shows an embodiment of a sampling circuit 800 configured to detect double crossings, which occur when the input signal crosses the same threshold (positive or negative) twice within a single sampling cycle. A digital filter may implement a rule that triggers an HF or PHF condition when a double crossing is detected. The circuit 800 may include two flip-flops 810, 814, each of which has its D and set inputs tied together. The D input of flip-flop 810 is complementary to that of flip-flop 814 and corresponds to the output of a comparator (e.g., pulse_high_comp or pulse_low_comp). The flip-flops 810, 814 may output to respective flip-flops 812, 816 to respectively produce pulse_x and not_pulse_x signals. Flip-flops 810, 812, 814, and 816 all operate on the same clock signal. Double crossing is detected by connecting the outputs of flip-flops 818, 820 to an OR gate 830. The D and CLR inputs of flip-flops 818, 820 are tied to the output of an AND gate 817, which operates on the outputs of flip-flops 810, 814. Delay matching elements, such as inverters, may be included.

Figure 16:
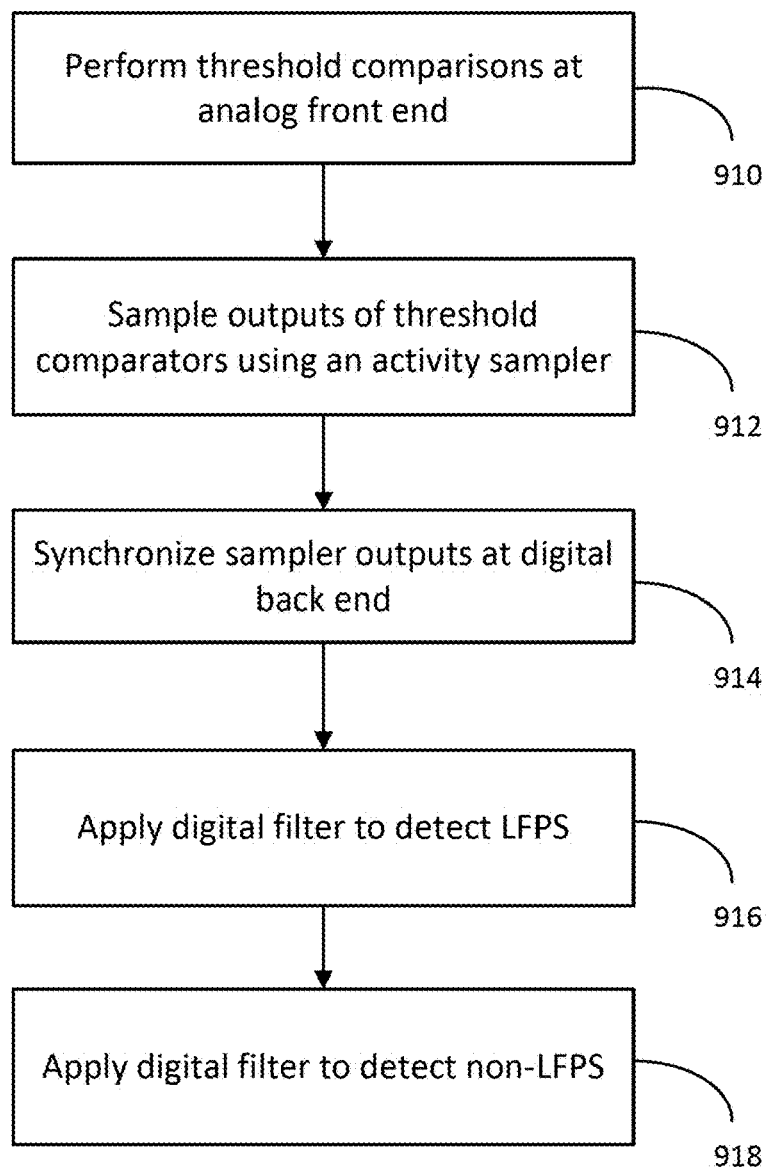
FIG. 16 shows an embodiment of a method for detecting LFPSs.

FIG. 16 shows an embodiment of a method 900 for detecting LFPSs. The method may be performed using any of the example activity samplers and digital filters discussed herein. At step 910, the analog front end may perform threshold comparisons on the input signal against a positive threshold and a negative threshold, using one or more comparators.

At step 912, the activity sampler samples the outputs of the threshold comparators.

At step 914, the digital back end synchronizes the sampler's outputs.

At step 916, a digital filter processes the synchronized sampler outputs to detect whether the input is an LFPS, e.g., using the above described rules.

At step 918, a second digital filter processes the synchronized sampler outputs to detect whether the input is a specific type of non-LFPS, such as a high-frequency data signal.

Embodiments of the digital filter may be implemented on a stand-alone circuit with one or more digital processing devices, including, for example, a programmable microprocessor, a field-programmable gate array (FPGA) or an application-specific integrated circuit (ASIC). The digital filter can also be implemented on a computer, e.g., using a central processing unit (CPU) that executes program instructions stored on a non-transitory computer-readable medium. Examples of computer-readable media include any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. For instance, steps illustrated in the flowcharts may be omitted and/or certain step sequences may be altered, and, in certain instances multiple illustrated steps may be simultaneously performed. Thus, it is intended that the specification and examples be considered as exemplary only, with a true scope of the present disclosure being indicated by the following claims and their equivalents.

What is claimed is:

1. A system for detecting a low-frequency periodic signal (LFPS), comprising:
   at least one comparator performing a threshold comparison on an analog input signal over a period of time;
   a sampling circuit generating digital signals by sampling a delayed output of the at least one comparator; and
   a digital detection circuit applying a set of detection rules to the digital signals, wherein the detection rules are configured to detect a presence or an absence of an LFPS based on predefined criteria concerning characteristics of the digital signals;
   wherein the sampling circuit includes:
     a first sampling device that samples and holds an output of the at least one comparator;
     a second sampling device that samples the delayed output, wherein the delayed output is a delayed version of the output of the at least one comparator; and
     a third sampling device that samples the same comparator output as the first sampling device, wherein the first sampling device and the third sampling device are reset at different times.

2. The system of claim 1, wherein the at least one comparator includes a first comparator comparing the analog input signal to a positive threshold and a second comparator comparing the analog input signal to a negative threshold, and wherein the digital signals include a first digital signal is driven based on whether the analog input signal is greater than the positive threshold, and a second digital signal driven based on whether the analog input signal is less than the negative threshold.

3. The system of claim 2, wherein the digital signals include a third digital signal driven based on whether the analog input signal is in between the positive and negative thresholds.

4. The system of claim 3, wherein the detection rules include, as a detection criterion, a de-assertion of the third digital signal between consecutive rising edges of the first digital signal or the second digital signal.

5. The system of claim 2, wherein the detection rules include, as a detection criterion, a minimum pulse duration for the first digital signal or the second digital signal.

6. The system of claim 2, wherein the detection rules include, as a detection criterion, a minimum distance between two consecutive rising edges of the first digital signal or the second digital signal.

7. The system of claim 2, wherein the detection rules include, as a detection criterion, a maximum duration of overlap between assertions of the first digital signal and the second digital signal.

8. The system of claim 2, wherein the detection rules include, as a detection criterion, a maximum number of cycles without any assertions of the first digital signal and without any assertions of the second digital signal.

9. The system of claim 1, wherein:
the second sampling device samples an output of the first sampling device, wherein the second sampling device periodically resets the first sampling device;
the third sampling device is reset by the second sampling device at times when the first sampling device is not reset; and
a fourth sampling device samples an output of the third sampling device.

10. The system of claim 1, wherein:
the first sampling device samples and holds the output of the at least one comparator until the first sampling device is reset by a periodic signal; and
the second sampling device samples an output of the first sampling device.

11. A method for detecting a low-frequency periodic signal (LFPS), comprising:
performing a threshold comparison on an analog input signal over a period of time, by at least one comparator;
generating digital signals by sampling a delayed output of the at least one comparator; and
applying a set of detection rules to the digital signals by a digital detection circuit, wherein the detection rules are configured to detect a presence or an absence of an LFPS based on predefined criteria concerning characteristics of the digital signals;
wherein the sampling includes:
sampling and holding an output of the at least one comparator by a first sampling device;
sampling the delayed output by a second sampling device, wherein the delayed output is a delayed version of the output of the at least one comparator, and
sampling the same comparator output as the first sampling device by a third sampling device, wherein the first sampling device and the third sampling device are reset at different times.

12. The method of claim 11, further comprising:
comparing the analog input signal to a positive threshold by a first comparator;
comparing the analog input signal to a negative threshold by a second comparator;
driving a first digital signal based on whether the analog input signal is greater than the positive threshold, and
driving a second digital signal based on whether the analog input signal is less than the negative threshold.

13. The method of claim 12, further comprising:
driving a third digital signal based on whether the analog input signal is in between the positive and negative thresholds.

14. The method of claim 13, wherein the detection rules include, as a detection criterion, a de-assertion of the third digital signal between consecutive rising edges of the first digital signal or the second digital signal.

15. The method of claim 12, wherein the detection rules include, as a detection criterion, a minimum pulse duration for the first digital signal or the second digital signal.

16. The method of claim 12, wherein the detection rules include, as a detection criterion, a minimum distance between two consecutive rising edges of the first digital signal or the second digital signal.

17. The method of claim 12, wherein the detection rules include, as a detection criterion, a maximum duration of overlap between assertions of the first digital signal and the second digital signal.

18. The method of claim 12, wherein the detection rules include, as a detection criterion, a maximum number of cycles without any assertions of the first digital signal and without any assertions of the second digital signal.

19. The method of claim 11, further comprising:
sampling an output of the first sampling device by the second sampling device;
periodically resetting the first sampling device by the second sampling device;
resetting the third sampling device by the second sampling device at times when the first sampling device is not reset; and
sampling an output of the third sampling device by a fourth sampling device.

20. The method of claim 11, further comprising:
sampling and holding the output of the at least one comparator by the first sampling device until the first sampling device is reset by a periodic signal; and
sampling an output of the first sampling device by the second sampling device.

\* \* \* \* \*